United States Patent [19]
Becker

[11] Patent Number: 5,773,978
[45] Date of Patent: Jun. 30, 1998

[54] BATTERY IMPEDANCE MONITOR

[75] Inventor: Thomas P. Becker, Kenosha, Wis.

[73] Assignee: Snap-on Technologies, Inc., Lincolnshire, Ill.

[21] Appl. No.: 736,992

[22] Filed: Oct. 25, 1996

[51] Int. Cl.⁶ .................................................. G01R 31/36
[52] U.S. Cl. ............................ 324/430; 324/436; 370/48; 340/636
[58] Field of Search ................................... 324/430, 436; 340/636, 455; 320/48

[56] References Cited

U.S. PATENT DOCUMENTS

| | | | |
|---|---|---|---|
| 3,731,189 | 5/1973 | Sharaf | 324/430 |
| 3,808,487 | 4/1974 | Feuillade | 324/430 |
| 3,873,911 | 3/1975 | Champlin . | |
| 4,006,319 | 2/1977 | Gartner . | |
| 4,035,588 | 7/1977 | Marshall et al. . | |
| 4,052,717 | 10/1977 | Arnold et al. . | |
| 4,204,162 | 5/1980 | Froidevaux . | |
| 4,231,027 | 10/1980 | Mann et al. . | |
| 4,259,639 | 3/1981 | Renirie . | |
| 4,268,856 | 5/1981 | Akazawa . | |
| 4,284,951 | 8/1981 | Dahl et al. . | |
| 4,423,378 | 12/1983 | Marino et al. . | |
| 4,517,517 | 5/1985 | Kinney . | |
| 4,816,768 | 3/1989 | Champlin . | |
| 4,825,170 | 4/1989 | Champlin . | |
| 4,912,416 | 3/1990 | Champlin . | |
| 4,929,931 | 5/1990 | McCuen | 324/430 |
| 5,047,722 | 9/1991 | Wurst et al. . | |
| 5,057,697 | 10/1991 | Hammond et al. . | |
| 5,140,269 | 8/1992 | Champlin . | |
| 5,211,037 | 5/1993 | Adamski et al. . | |
| 5,343,380 | 8/1994 | Champlin . | |
| 5,431,625 | 7/1995 | Fabian et al. . | |
| 5,585,728 | 12/1996 | Champlin | 324/430 |
| 5,598,098 | 1/1997 | Champlin | 324/430 |

*Primary Examiner*—Ernest F. Karlsen
*Assistant Examiner*—Jose M. Solis
*Attorney, Agent, or Firm*—Emrich & Dithmar

[57] ABSTRACT

A battery impedance monitor includes a driver section having an oscillator which produces a pulsating loading signal which controls periodic loading of the battery to produce at its output terminals a pulsating voltage component having a peak-to-peak amplitude superimposed on the DC output voltage of the battery. This pulsating voltage component is detected in a measuring section, which applies the battery output through a voltage divider to a peak detector which outputs an indicating voltage level proportional to the peak-to-peak amplitude of the pulsating output signal, this indicating level being held on a storage capacitor. The voltage divider includes a Zener diode which shifts the DC level of the battery output without affecting the amplitude of the pulsating component. The measuring section is electrically connected to the driver section only through the battery terminals, but the storage capacitor is coupled to the oscillator through a load resistor and an opto-isolator which provides a discharge path for the storage capacitor during each loading pulse, so that the detector can follow decreasing as well as increasing indicator voltage levels. A delay circuit delays application of the loading pulses to the battery so that the discharge path is removed before the end of each pulse of the battery output voltage.

17 Claims, 2 Drawing Sheets

BATTERY IMPEDANCE MONITOR

BACKGROUND OF THE INVENTION

1. Field of the Invention

This invention relates to apparatus for determining the electrical condition of a storage battery and, in particular, to determination of the capacity of the storage battery by measuring its internal impedance or conductivity.

2. Description of the Prior Art

There is a known relationship between a battery's capacity, i.e., its ability to deliver power to a load, and its internal resistance or impedance. Thus, battery impedance monitors are well known which simply apply a load to the battery and monitor its change in terminal voltage as an indication of its internal resistance, in accordance with Ohm's law. However, the load which must be imposed on the battery by such prior testers is quite substantial.

It is also known to provide a battery impedance monitor which applies a relatively small load to the battery by using a technique known as dynamic conductance measurement. Such a system is disclosed in U.S. Pat. No. 3,873,911 to Champlin. That patent describes a closed loop circuit which includes the subject battery in series with an AC current sink and a high gain amplifier. A tiny signal is injected into the amplifier. The amplifier responds by modulating an otherwise DC current through the battery, which results in a differential or balancing modulated voltage across the battery terminals. The higher the battery resistance, the lower is the current required to balance the amplifier. The AC component of the voltage across the battery is developed across a sensing series resistor, also within the loop, and is inversely related to battery resistance. This AC voltage is further amplified, detected and scaled, providing a meter indication in terms of battery conductivity.

Champlin uses a 100 Hz. AC injection current and detects the resultant AC voltage component with a half-wave switching detector. This detection process essentially wastes about 50% of the available peak-to-peak AC signal amplitude resulting in reduced resolution. By way of illustration, referring to FIG. 4 of the drawings herein, the voltage input to the Champlin detection circuitry is designated 11 with the AC component in the form of a pulse, being designated at 12, swinging about a reference level designated $V_{REF}$. In a typical situation, if the DC battery voltage is 12.6 volts, typical of an automotive lead-acid battery, the peak-to-peak amplitude of the AC pulse component might be approximately 10 mv. Champlin uses a half-wave detection circuit that clips the top half of the input waveform leaving less than 50% of the signal's original amplitude and then filters out most of the AC component, as shown in waveform 15 of FIG. 4.

Champlin also uses a traditional four-wire probe, typical of low-ohms precision instrumentation, to separate current injection from signal detection at the battery terminals. However, his driver and detection circuits share a common circuit ground and power supply. Such circuit coupling can be responsible for noise and spurious signals that compromise system accuracy.

SUMMARY OF THE INVENTION

It is a general object of the invention to provide an improved battery impedance monitor of the dynamic conductance measurement type, which avoids the disadvantages of prior monitors while affording additional structural and operating advantages.

An important feature of the invention is the provision of a battery impedance monitor of the type set forth, which permits adjustment of the DC level of the battery output voltage without affecting the peak-to-peak amplitude of the AC component thereof.

A further feature of the invention is the provision of a battery impedance monitor of the type set forth, which utilizes a pulsating AC input signal and a detector which stores an indicating voltage level proportional to the peak-to-peak amplitude of the pulsating component of the output voltage, and which resets the detection circuitry during each pulse so that it can follow decreasing as well as increasing voltage levels.

Still another feature of the invention is the provision of a battery impedance monitor of the type set forth, wherein the detection circuitry is electrically isolated from the battery loading circuitry except for their connection to the battery terminals.

Certain ones of these features are attained by providing an impedance monitor for a battery having positive and negative output terminals across which a DC output voltage is provided, the monitor comprising: an oscillatory loading circuit adapted to be coupled across the battery terminals for periodically loading the battery to produce at the output terminals a time-varying voltage component having a peak-to-peak amplitude superimposed on the DC output voltage, and a measuring circuit adapted to be connected across the battery output terminals for sensing the time-varying voltage component to determine the internal impedance of the battery, the measuring circuit including an impedance portion connected in series with the battery when the measuring circuit is connected across the battery terminals and having a finite DC impedance and a substantially zero AC impedance for shifting the level of the DC output voltage without affecting the peak-to-peak amplitude of the time-varying component.

Further features are attained by providing such an impedance monitor wherein the measuring circuit is electrically connected to the loading circuit only at the output terminals of the battery.

Still further features of the invention are attained by providing such an impedance monitor wherein an oscillatory circuit provides a time-varying signal including periodic loading pulses, which are coupled across the battery terminals for periodically loading the battery so that the time-varying voltage component includes voltage pulses having a peak-to-peak amplitude superimposed on the DC output voltage. The measuring circuit generates an indicating voltage level proportional to the peak-to-peak amplitude of the voltage pulses for determining the internal impedance of the battery, the measurement circuit including a storage element for storing the indicating voltage level, and a reset circuit coupled between the oscillatory circuit and the storage element for providing a discharge path for the storage element during each periodic input pulse to permit the storage element to store a decreasing indicating voltage level.

The invention consists of certain novel features and a combination of parts hereinafter fully described, illustrated in the accompanying drawings, and particularly pointed out in the appended claims, it being understood that various changes in the details may be made without departing from the spirit, or sacrificing any of the advantages of the present invention.

BRIEF DESCRIPTION OF THE DRAWINGS

For the purpose of facilitating an understanding of the invention, there is illustrated in the accompanying drawings a preferred embodiment thereof, from an inspection of which, when considered in connection with the following description, the invention, its construction and operation, and many of its advantages should be readily understood and appreciated.

DESCRIPTION OF THE PREFERRED EMBODIMENT

Figure 1:
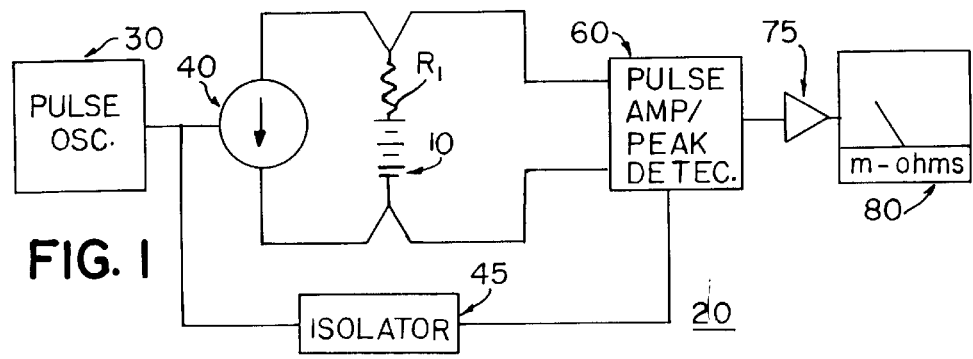
FIG. 1 is a partially schematic and partially block diagrammatic view of a battery impedance monitor in accordance with the present invention.

Referring to FIG. 1, there is illustrated an impedance monitor, generally designated by the numeral 20, constructed in accordance with and embodying the features of the present invention. The impedance monitor 20 includes a pulse oscillator circuit 30 which drives a switched precision current sink 40 connected across the terminals of battery 10, which has an internal resistance $R_I$. Also connected across the battery terminals is a pulse amplifier/peak detector 60, the output of which is coupled through a level shifter 75 to a milliohmmeter 80. The output of the pulse oscillator 30 is coupled to the pulse amplifier/peak detector 60 through an isolator 45.

In operation, a momentary load, preferably 2.0 amps for about 15 ms, is repetitively placed across the battery 10 by the switched precision current sink 40. The pulse amplifier/peak detector 60 senses the change in battery terminal voltage resulting from the momentary load on the battery, captures the peak level of that change, amplifies it and holds it between repetitive load pulses. That level is then shifted to reference circuit common in the level shifter 75 for application to the meter 80. The isolator 45 functions as a switched reset circuit, switched by the pulses from the oscillator 30, for synchronizing the detection circuitry to the current sink 40 for providing an output update at each load pulse. This permits the detection circuitry to follow decreasing as well as increasing voltage levels, as will be explained more fully below, while maintaining electrical isolation between the loading and detection circuitry except for their connection to the battery terminals.

Figure 2:
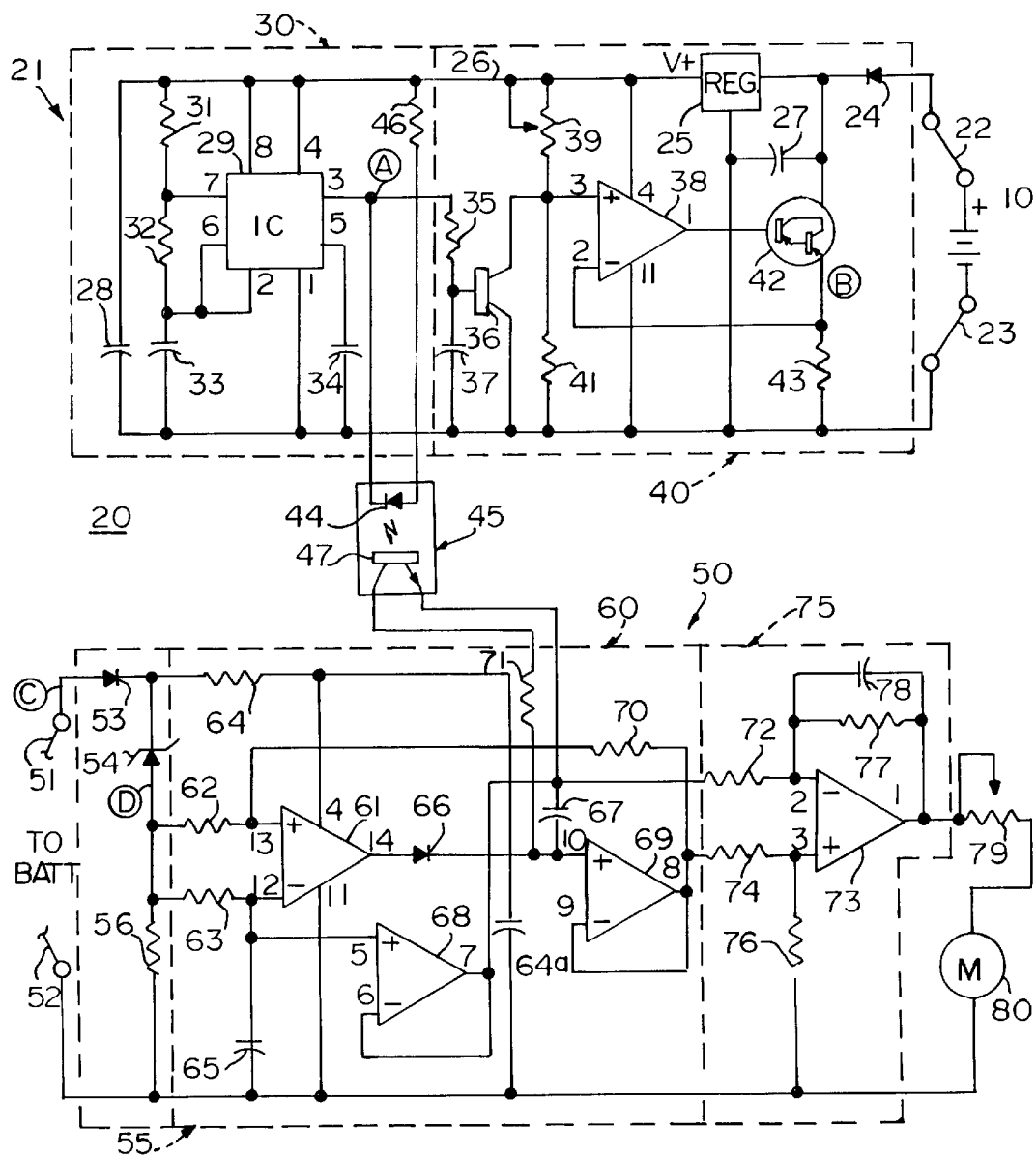
FIG. 2 is a schematic circuit diagram of the impedance monitor of FIG. 1.

Referring now to FIG. 2, the details of the impedance monitor 20 will be described. The impedance monitor 20 includes a driver section 21 which constitutes an oscillatory battery loading circuit including the pulse oscillator circuit 30 and the switched precision current sink 40. The driver section 21 has connectors 22 and 23 adapted to respectively be connected to the positive and negative output terminals of the battery 10. Connector 23 is connected to circuit common. The connector 22 is coupled to the anode of a diode 24. A voltage regulator 25 is connected between the cathode of the diode 24 and the negative battery terminal connector 23. The regulator 25 may be of the type uA7808 and outputs a regulated DC supply voltage V+, preferably 8.0 volts, on the conductor 26. Connected across the input of the regulator 25 is a capacitor 27, while a capacitor 28 is connected across its output.

The heart of the pulse oscillator circuit 30 is an integrated circuit ("IC") 29, which may be of the type LM555, and has its pins 4 and 8 connected to the V+ supply voltage and its pin 1 connected to circuit common. Pin 7 of IC 29 is connected to the V+ supply through a resistor 31 and is connected to circuit common through the series combination of a resistor 32 and a capacitor 33, the junction between which is also connected to pins 2 and 6 of IC 29. Pin 5 of IC 29 is connected through a capacitor 34 to circuit common. The output of the oscillator IC 29 is at pin 3, which is connected to the input of the switched precision current sink 40.

More specifically, the oscillator output is connected through a resistor 35 to the base of a switching transistor 36, which may be a type 2N3904. The base of the transistor 36 is also connected through a capacitor 37 to circuit common, the emitter of the transistor being connected directly to circuit common. The transistor collector is connected to the non-inverting input of an operational amplifier ("op amp") 38, which input is also connected through a variable resistor 39 to the V+ supply voltage. The op amp 38 also has pins 4 and 11 which are, respectively, connected to the V+ supply and circuit common. The non-inverting input of the op amp 38 is also connected through a resistor 41 to circuit common. The output of the op amp 38 is connected to the base of a Darlington transistor 42, which may be of a type 2N6386, which has its collector connected to the cathode of the diode 24. The emitter of the transistor 42 is connected to the non-inverting input of the op amp 38 and is also connected through a resistor 43 to circuit common.

The isolator 45 is preferably an opto-isolator, which may be of a type H11AA1, and includes an LED 44 and a photo-transistor 47. The LED 44 has its cathode connected to the output of the oscillator IC 29 and its anode connected through a resistor 46 to the V+ supply voltage.

The impedance monitor 20 also includes a measurement section 50 which includes the pulse amplifier/peak detector 60 and the level shifter 75. The measurement section 50 has connectors 51 and 52 which are, respectively, adapted to be connected to the positive and negative output terminals of the battery 10, the connector 52 being connected to circuit common. The connector 51 is connected to the anode of a diode 53. Connected in series between the cathode of the diode 53 and circuit common is a Zener diode 54 and a resistor 56, the latter being connected to the anode of the Zener diode 54. The diodes 53 and 54 and the resistor 56 form a voltage divider 55, the output of which is applied to the input of the pulse amplifier/peak detector 60.

More specifically, the junction between the Zener diode 54 and the resistor 56 is connected through a resistor 62 to the inverting input terminal, and through a resistor 63 to the non-inverting input terminal, of an op amp 61. The op amp 61 has a pin 4 connected through a resistor 64 to the cathode of the diode 53 and through a capacitor 64a to a circuit common. A pin 11 is also connected to circuit common. The non-inverting input of the op amp 61 is also connected through a capacitor 65 to circuit common. The output of the op amp 61 is connected to the anode of a diode 66, the cathode of which is connected through a capacitor 67 to the output of an op amp 68, which has its non-inverting input connected to the non-inverting input of the op amp 61, and which has its inverting input connected to its output. The cathode of the diode 66 is also connected to the non-inverting input of an op amp 69, the output of which is connected to its inverting input and is also connected through a resistor 70 to the inverting input of the op amp 61. The output of op amp 68 is also connected to the emitter of the phototransistor 47 of opto-isolator 45, the collector of which is connected through a resistor 71 to the non-inverting input of the op amp 69.

The output of the pulse amplifier/peak detector 60 is connected to the level shifter 75. In particular, the output of the op amp 68 is connected through a resistor 72 to the inverting input of an op amp 73, the non-inverting input of which is connected through a resistor 74 to the output of the op amp 69 and through a resistor 76 to circuit common. The output of the op amp 73 is connected to its inverting input through the parallel combination of a resistor 77 and a capacitor 78. The op amp 73 and its associated components 72, 74, and 76–78 form the level shifter 75. The op amps 61, 68, 69 and 73 may be a type LM324 quad op amp.

The output of the level shifter 75, at the output of the op amp 73 is connected through a variable resistor 79 to one terminal of the meter 80, the other terminal of which is connected to circuit common.

In operation, the rectifier diode 24 protects the driver section 21 against inadvertent battery reversal. The voltage regulator 25 regulates the battery terminal voltage to provide the V+ power supply voltage. Capacitor 27 is a bypass capacitor which prevents oscillation of the regulator 25. Capacitor 28 is a power supply filter.

The operation of the impedance monitor 20 will now be described in detail, with the aid of FIG. 3, which shows four graphs, respectively labeled A–D, of the signals appearing at four correspondingly labeled points in the circuitry of FIG. 2, with voltage measured along the vertical axis and time along the horizontal axis. The oscillator IC 29 is configured in the astable oscillator mode and preferably provides an approximately 15-ms pulse approximately every 500 ms. The pulse switches from a high of about 8 volts to circuit common (zero volts). The resistors 31 and 32 and the capacitor 33 determine the pulse width and repetition rate. The capacitor 34 provides circuit stability.

The pulsating output of the oscillator IC 29 drives the switching transistor 36 through the current-limiting resistor 35. The capacitor 37, in conjunction with the resistor 35, delays the switching of the transistor 36 by about 1 ms. The oscillator output also drives the LED 44 of the opto-isolator 45. The resistor 46 limits LED current.

Each pulse from the oscillator circuit 30 turns off the transistor 36. Thus, between 15-ms pulses, the transistor 36 shorts the resistor 41 to ground, thereby providing zero volts at the non-inverting input of the op amp 38. During each 15 Ms pulse, when the transistor 36 is turned off, the voltage level at the non-inverting input of the op amp 38 switches to a finite positive voltage, preferably 4.0 volts, as established by the voltage divider circuit of the resistors 39 and 41.

The op amp 38 drives the Darlington transistor 42, which is connected in a common-emitter configuration. The op amp 38, the transistor 42 and the resistor 43 form a precision constant current driver circuit, with the current level being precision adjustable by means of the variable resistor 39. With 4.0 volts at is non-inverting input, the op amp 38 drives the transistor 42 to maintain exactly 4.0 volts across the resistor 43, which is preferably a 2.0 ohm resistor. Thus, exactly 2.0 amps of current pass through the transistor 42 and the resistor 43 and whatever source is providing the current during each 15 ms pulse, i.e., the battery 10 under test.

Each momentary loading of the battery 10 by the driver section 21 produces a voltage change across the battery terminals. The battery output voltage is applied through the diode 53, a battery reversal protection diode, which drops a constant 0.6 VDC. Another constant 7.5 VDC is dropped through the Zener diode 54. These diodes, in series with the resistor 56 across the battery terminals, function as a voltage divider which effectively shifts the level of the battery output voltage from a nominal 12.6 VDC down to approximately 4.5 VDC at the input of the op amp 61. This places the DC component of the input signal to the measuring section 50 within the normal operating area of the inputs of the pulse amplifier/peak detector 60, but without affecting the amplitude of the pulsating or AC component of the input signal, because of the substantially zero AC impedance of the diodes 53 and 54.

The op amps 61, 68 and 69, with the silicon switching diode 66 and storage capacitor 67, form a standard precision peak detector circuit. The 4.5 VDC across resistor 56 is fed to the non-inverting input of op amp 61. Capacitor 65, in conjunction with resistor 63, effectively filters out the AC component at the non-inverting input of the op amp 61, thus providing a stable DC voltage reference. The AC voltage change is coupled directly to the inverting input of the op amp 61 through the resistor 62. The output of the op amp 61 is coupled through the diode 66 to charge the capacitor 67, as referenced to the output of the op amp 68, which is configured as a voltage follower for the reference voltage established at the non-inverting input of the op amp 61. The output of the op amp 69, which is also configured as a voltage follower, senses the voltage appearing across the capacitor 67 without discharging it, and drives the feedback resistor 70 back to the non-inverting input of the op amp 61. The ratio of the resistor 62 to the resistor 70 establishes the voltage gain of the peak detector circuit, preferably a gain of 20.

The photo-transistor 47 of the opto-isolator 45 is connected across the capacitor 67 in series with the resistor 71. Thus, the opto-isolator 45 provides a discharge path for the capacitor 67 through the resistor 71 during each output pulse of the oscillator circuit 30. Since each such pulse is ahead of the voltage pulse at the input of the peak detector circuit by approximately 1 ms (by reason of the delay circuit 35, 37, discussed above), the peak detector circuit reestablishes a new voltage across the storage capacitor 67 at the end of each load pulse. Thus, the opto-isolator 45 serves to reset the peak detector circuit so it can track decreasing as well as increasing input signals, while at the same time maintaining electrical isolation between the driver and measuring sections 21 and 50.

The op amp 73 is configured as a differential amplifier. Its gain is a function of the ratio of the values of the resistors 77 to 72 and 76 to 74. In addition to adding some gain (preferably 2), the purpose of this amplifier is to shift the output of the peak detector down to a zero volts reference, instead of the approximately 4.5 volt reference explained above. The output of the op amp 73 also drives a 1.0 milliamp analog meter 80. The variable resistor 79 is used to calibrate the meter scale.

Figure 3:
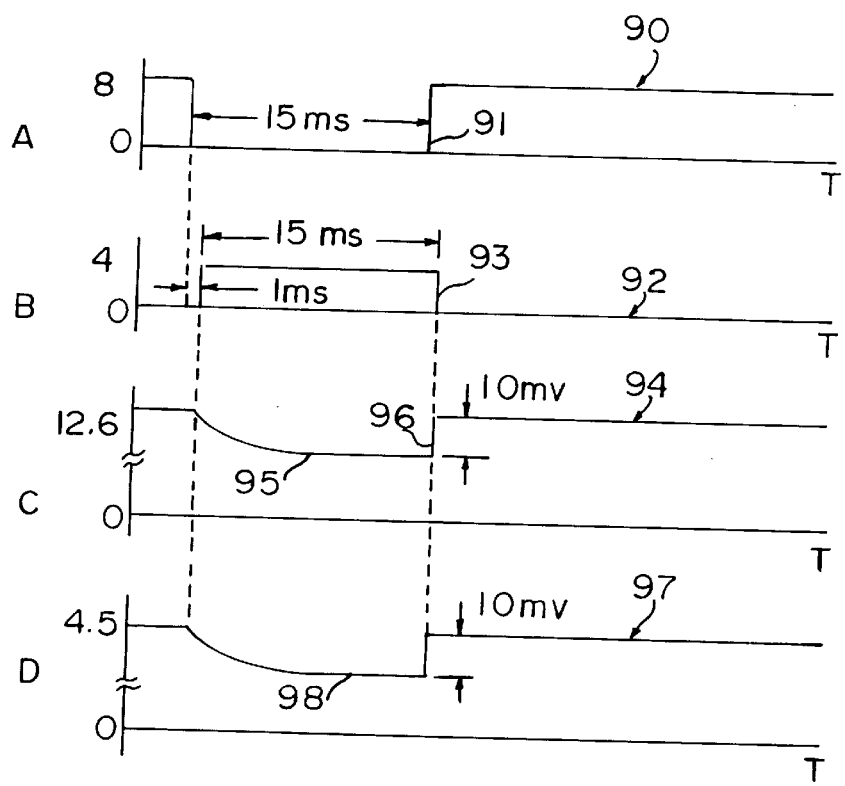
FIG. 3 is a graph of waveforms of signals at several points in the circuitry of FIG. 2.
Figure 4:
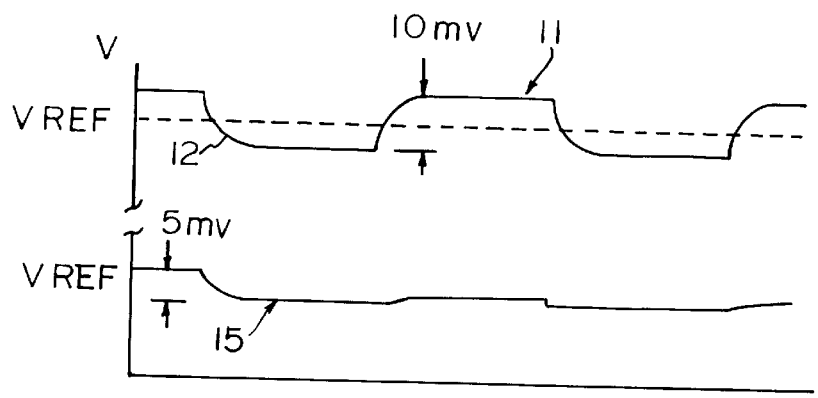
FIG. 4 is a graph of waveforms at selected points of a prior art impedance monitor.

Referring to FIG. 3, Graph A shows the waveform of the signal 90 at the output of the pulse oscillator circuit 30, illustrating one of the 15-ms pulses, designated 91. Graph B shows the waveform 92 of the voltage across the resistor 43, which determines the loading current for the battery during each pulse. This signal will have pulses 93 which are the same width as the output pulses 91 of the oscillator circuit 30, but which have an amplitude of about 4 volts and which are delayed by 1 ms because of the delay imparted by the resistor 35 and the capacitor 37, as described above. Graph C shows the waveform 94 of the voltage across the terminals of the battery 10. This voltage typically is about 12.6 VDC and will have a pulsating AC component which follows the loading pulses applied by the driver section 21, one such pulse being designated at 95. Thus, the trailing edge 96 of the pulse 95 is coincident in time with the trailing edge of the battery loading pulse 93 and delayed 1 ms with respect to the output pulse 91 of the oscillator 30. The voltage pulse 95 across the battery terminals has a peak-to-peak amplitude which is typically approximately 10 mv, the vertical scale of the Graph C being shortened to permit this amplitude to be clearly shown. Referring to Graph D, there is shown the waveform 97 of the voltage signal at the input of the op amp 61 of the peak detector circuit. As can be seen, this waveform is substantially identical to the waveform 94 of Graph C, except that the DC level has been shifted down to 4.5 VDC. The 10 mv peak-to-peak amplitude of each pulse 98 of the AC component of the voltage remains unaffected, however.

The output of the op amp 61 of the peak detector circuit is a voltage level which is proportional to the peak-to-peak amplitude of the AC or pulse component of the voltage across the terminals of the battery 10. This voltage level is stored on the capacitor 67, which holds it between pulses, so that it can drive the meter 80. As was indicated above, the opto-isolator 45 provides a discharge path for the capacitor 67 for the duration of each pulse from the output of the pulse oscillator circuit 30. Thus, during each pulse the peak detector circuit is essentially reset and reestablishes a new voltage level across capacitor 67, thereby permitting the detector to follow a decreasing voltage level as well as a increasing level. Referring to Graphs A and D of FIG. 3, it can be seen that the discharge path for the capacitor 67, controlled by pulse 91, is removed before the end of the pulse 98 in the voltage across the battery terminals. This ensures that there will be no discharge path for the capacitor 67 between pulses, so that the capacitor 67 will accurately hold the voltage level appearing at the output of the op amp 61.

Because the opto-isolator 45 does not provide an electrical connection between the driver and measuring sections 21 and 50, the sections remain electrically isolated from each other, except for their connection of the battery terminals.

In summary, the voltage of the battery 10 under test is level shifted without loss of amplitude of the AC component. The output of the peak detector circuit is a function of the amplitude of the AC component across the battery times the gain of the peak detector circuit. This detector output voltage is retained across the storage capacitor 67 until it is reset by the opto-isolator 45. The differential amplifier 73 provides another stage of gain and shifts the output voltage to a ground reference.

Those skilled in the art will recognize that the component values and resulting voltage, current, resistance and timing elements are subject to variation without changing the measurement concept. A digital meter could replace the analog meter 80. The circuit functions of the driver and measuring sections 21 and 50 could be emulated using microcomputer/microcontroller techniques. It will also be understood that battery internal resistance (or conductivity) is not a direct measurement factor of battery power density. Various influences, such as state-of-charge and temperature, affect simple impedance in a non-linear fashion. Thus, the present battery impedance monitor 20 is useful when test conditions or measurement results control for such variables.

From the foregoing, it can be seen that there has been provided an improved battery impedance monitor of the dynamic conductance type which level shifts the voltage across the battery without affecting the amplitude of the AC component thereof, resets the detector circuitry to permit it to follow decreasing as well as increasing voltage levels, and maintains electrical isolation between the input and output sections of the circuitry.

While particular embodiments of the present invention have been shown and described, it will be obvious to those skilled in the art that changes and modifications may be made without departing from the invention in its broader aspects. Therefore, the aim in the appended claims is to cover all such changes and modifications as fall within the true spirit and scope of the invention. The matter set forth in the foregoing description and accompanying drawings is offered by way of illustration only and not as a limitation. The actual scope of the invention is intended to be defined in the following claims when viewed in their proper perspective based on the prior art.

I claim:

1. An impedance monitor for a battery having positive and negative output terminals across which a DC output voltage is provided, said monitor comprising:

an oscillatory loading circuit adapted to be coupled across the battery terminals for periodically loading the battery to produce at the output terminals a time-varying voltage component having a peak-to-peak amplitude superimposed on the DC output voltage, and a measuring circuit adapted to be connected across the battery output terminals for sensing the time-varying voltage component to determine the internal impedance of the battery, said measuring circuit including an impedance portion connected in series with the battery when said detector circuit is connected across the battery terminals and having a finite DC impedance and a substantially zero AC impedance for shifting the level of the DC output voltage without affecting the peak-to-peak amplitude of the time-varying component, said measuring circuit including a peak detector for generating, in response to the output of said impedance portion, an indicating voltage level proportional to the peak-to-peak amplitude of the time-varying voltage component.

2. The impedance monitor of claim 1, wherein said measuring circuit includes a voltage divider consisting of said impedance portion and a resistance.

3. The impedance monitor of claim 1, wherein said impedance portion includes a uni-directional current element.

4. The impedance monitor of claim 3, wherein said unidirectional current element is a diode.

5. The impedance monitor of claim 4, wherein said diode is a Zener diode.

6. An impedance monitor for a battery having positive and negative output terminals across which a DC output voltage is provided, said monitor comprising:

an oscillatory loading circuit adapted to be coupled across the battery terminals for periodically loading the battery to produce at the output terminals a time-varying voltage component having a peak-to-peak amplitude superimposed on the DC output voltage, and a detector circuit adapted to be connected across the battery output terminals for sensing the time-varying voltage component to determine the internal impedance of the battery, said detector circuit being electrically connected to said loading circuit only at the output terminals of the battery.

7. The impedance monitor of claim 1, and further comprising a meter coupled to said measuring circuit for providing an indication of the internal impedance of the battery.

8. An impedance monitor for a battery having positive and negative output terminals across which a DC output voltage is provided, said monitor comprising:

an oscillatory circuit providing a time-varying signal including periodic loading pulses, means for coupling the oscillatory circuit across the battery terminals for periodically loading the battery to produce at the output terminals a time-varying voltage component including voltage pulses having a peak-to-peak amplitude superimposed on the DC output voltage, a detector circuit adapted to be connected across the battery output terminals for sensing the time-varying voltage component and generating an indicating voltage level proportional to the peak-to-peak amplitude of the voltage pulses for determining the internal impedance of the battery, said detector circuit including a storage element for storing the indicating voltage level, and a reset circuit coupled between said oscillatory circuit and said storage element for providing a discharge path for the storage element during each periodic loading pulse to permit the storage element to store a decreasing indicating voltage level.

9. The impedance monitor of claim 8, wherein said storage element includes a capacitor.

10. The impedance monitor of claim 8, wherein said reset circuit includes a switch circuit.

11. The impedance monitor of claim 10, wherein said means for coupling the oscillatory circuit across the battery terminals includes a delay circuit for delaying the appearance of each of said loading pulses at the battery output terminals and thereby delaying each of said voltage pulses, whereby the discharge path provided by said reset circuit during each loading pulse is removed before the termination of the corresponding voltage pulse.

12. The impedance monitor of claim 10, wherein said switch circuit includes an optoisolator.

13. The impedance monitor of claim 8, wherein said detector circuit includes a peak detector for generating the indicating voltage level.

14. The impedance monitor of claim 6, and further comprising coupling circuitry providing a non-electrical coupling between said oscillatory circuit and said detector circuit.

15. The impedance monitor of claim 14, wherein said coupling circuitry includes an optical coupling.

16. The impedance monitor of claim 15, wherein said optical coupling includes an optoisolator.

17. The impedance monitor of claim 16, wherein said detector circuit includes a peak detector for generating an indicating voltage level proportional to the peak-to-peak amplitude of the time-varying voltage component, and a storage element for storing the indicating voltage level, and further comprising a reset circuit for periodically resetting said storage element so that it can store a decreasing indicating voltage level.

* * * * *